US012707776B2

(12) United States Patent
Lee et al.

(10) Patent No.: US 12,707,776 B2
(45) Date of Patent: Aug. 11, 2026

(54) DISPLAY APPARATUS HAVING LOW SPECULAR REFLECTION AND IMPROVED CONTRAST RATIO

(71) Applicant: Samsung Display Co., Ltd., Yongin-si (KR)

(72) Inventors: Junhan Lee, Yongin-si (KR); Yunha Ryu, Yongin-si (KR); Dasom Kang, Yongin-si (KR); Shintack Kang, Yongin-si (KR); Kyungbin Kim, Yongin-si (KR); Yujin Kim, Yongin-si (KR); Kisoo Park, Yongin-si (KR); Seungjun Yu, Yongin-si (KR); Hongmin Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 400 days.

(21) Appl. No.: 18/206,548

(22) Filed: Jun. 6, 2023

(65) Prior Publication Data

US 2023/0395763 A1 Dec. 7, 2023

(30) Foreign Application Priority Data

Jun. 7, 2022 (KR) ........................ 10-2022-0069109
Apr. 24, 2023 (KR) ........................ 10-2023-0053526

(51) Int. Cl.
*H10H 20/855* (2025.01)
*H10H 20/851* (2025.01)

(52) U.S. Cl.
CPC ...... *H10H 20/855* (2025.01); *H10H 20/8512* (2025.01)

(58) Field of Classification Search
CPC ........... G01N 2021/3181; G01N 21/35; H10H 20/8512; H10H 20/8513
See application file for complete search history.

(56) References Cited

U.S. PATENT DOCUMENTS 10,371,875 B2 8/2019 Kim et al.
2016/0099280 A1* 4/2016 Huang ................ H10F 39/8063 438/70

(Continued)

FOREIGN PATENT DOCUMENTS

JP 2021-015731 A 2/2021
KR 10-1934545 B1 1/2019

(Continued)

OTHER PUBLICATIONS

Belfield, K.D.,et al. (2000), Multiphoton-absorbing organic materials for microfabrication, emerging optical applications and non-destructive three-dimensional imaging. J. Phys. Org. Chem., 13: 837-849. https://doi.org/10.1002/1099-1395(200012)13: 12 (Year: 2000).*

(Continued)

*Primary Examiner* — Tracie Y Green
(74) *Attorney, Agent, or Firm* — Womble Bond Dickinson (US) LLP

(57) ABSTRACT

A display apparatus includes: a light-emitting device layer including a first light-emitting device; a light control layer arranged on the light-emitting device layer and including a first light control unit; and an optical functional layer arranged on the light control layer and configured to reduce near-infrared transmittance, wherein the first light-emitting device is configured to emit first-color light of a near-infrared region and the light control layer is configured to emit second-color light of a visible region.

20 Claims, 6 Drawing Sheets

(56) References Cited

U.S. PATENT DOCUMENTS

2017/0317132 A1* 11/2017 Hatakeyama ......... H10F 39/184
2020/0358018 A1 11/2020 Kim et al.
2021/0013265 A1* 1/2021 Hinata ................... H10K 59/38
2021/0151484 A1* 5/2021 Moriya ................. H10F 39/806

FOREIGN PATENT DOCUMENTS

KR 10-2020-0129210 A 11/2020
WO WO-2019176975 A1 * 9/2019 ............... C09K 3/00

OTHER PUBLICATIONS

WO-2019176975-A1, Machine Translation (Year: 2019).*
Lee, Multi-Photon Excited Luminescence by Rare-Earth Ions, Deep L, 12 pps; English Translation Document, 4 pps.
Junzi Li et al., "Spectral Dynamics and Multiphoton Absorption Properties of All-Inorganic Perovskite Nanorods", The Journal of Physical Chemistry Letters, 2020, pp. 4817-4825, vol. 11, American Chemical Society.
Guichuan Xing et al., "Three-Photon Absorption in Seeded CdSe/CdS Nanorod Heterostructures", The Journal of Physical Chemistry Letters, Aug. 3, 2011, pp. 17711-17716, vol. 115, American Chemical Society.
Mariacristina Rumi et al., "Two-photon absorption: an overview of measurements and principles", Advances in Optics and Photonics, Aug. 26, 2010, pp. 451-518, vol. 2, Optical Society of America.
Miłosz Pawlicki et al., "Two-Photon Absorption and the Design of Two-Photon Dyes", Angewandte Chemie International Editon, Apr. 15, 2009, pp. 3244-3266, vol. 48, Issue 18, Wiley-VCH Verlag Gmbh & Co. KGaA, Weinheim.

* cited by examiner

DISPLAY APPARATUS HAVING LOW SPECULAR REFLECTION AND IMPROVED CONTRAST RATIO

CROSS-REFERENCE TO RELATED APPLICATION

This application claims priority to and the benefit of Korean Patent Application No. 10-2022-0069109, filed on Jun. 7, 2022, and Korean Patent Application No. 10-2023-0053526, filed on Apr. 24, 2023, in the Korean Intellectual Property Office, the disclosure of which is incorporated by reference herein in its entirety.

BACKGROUND

1. Field

One or more embodiments relate to a display apparatus.

2. Description of the Related Art

A display apparatus is an apparatus that visually displays data. The display apparatus may be utilized as a display unit of a small product, such as a mobile phone, or may be utilized as a display unit of a large product, such as a television.

The display apparatus may include a plurality of sub-pixels that receive electrical signals and emit light to display an image to the outside. For a full-color display apparatus, the plurality of sub-pixels may be to emit light of different colors. In this regard, at least some of the plurality of sub-pixels may have a filter unit for converting colors. Light of a first wavelength band generated in some of the plurality of sub-pixels may be converted into light of a second wavelength band through a corresponding filter unit, and then may be extracted to the outside.

SUMMARY

Aspects of embodiments are directed toward a display apparatus. More particularly, aspects of embodiments are directed toward a structure of a light-emitting display apparatus.

Additional aspects will be set forth in part in the description which follows and, in part, will be apparent from the description, or may be learned by practice of the presented embodiments of the disclosure.

According to one or more embodiments, a display apparatus includes a light-emitting device layer, a light control layer arranged on the light-emitting device layer, and an optical functional layer arranged on the light control layer and reduces near-infrared transmittance, wherein the light-emitting device layer emits a first-color light of (e.g., in) in a near-infrared region and the light control layer emits a second-color light of a visible region.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
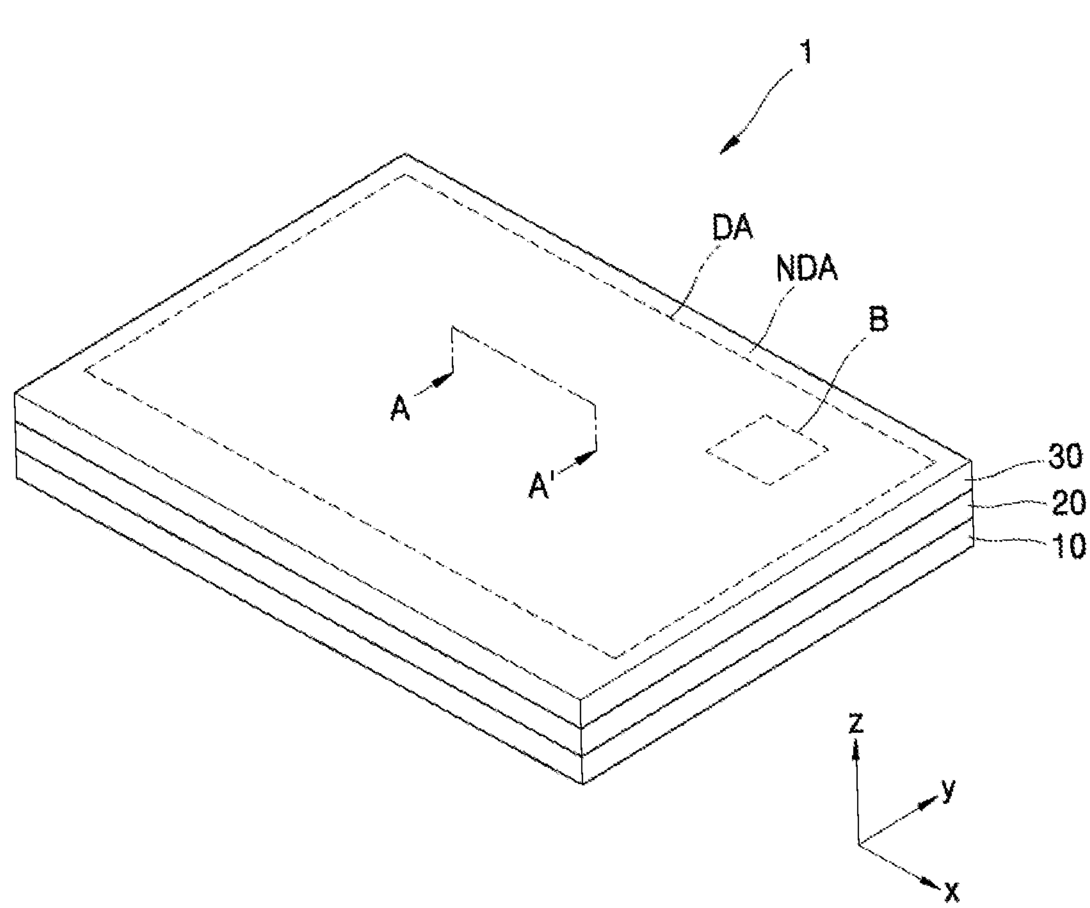
FIG. 1 is a schematic perspective view of a display apparatus according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As utilized herein, the term “and/or” includes any and all combinations of one or more of the associated listed items. Throughout the disclosure, the expression “at least one of a, b or c” “at least one of a, b, and/or c”, “at least one selected from among a, b, and c”, etc. (three or more item case), indicates only a, only b, only c, both (e.g., simultaneously) a and b, both (e.g., simultaneously) a and c, both (e.g., simultaneously) b and c, all of a, b, and c, or variations thereof.

In the present specification, “A and/or B” represents A or B, or A and B. The expression “at least one of A and B” (two item case) indicates only A, only B, both (e.g., simultaneously) A and B, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Hereinafter, embodiments of the disclosure will be described in more detail with reference to the accompanying drawings. The same or corresponding components will be denoted by the same reference numerals, and thus redundant description thereof will not be provided.

It will be understood that although the terms “first,” “second,” etc. may be utilized herein to describe one or more suitable components, these components should not be limited by these terms. These components are only utilized to distinguish one component from another.

An expression utilized in the singular encompasses the expression of the plural, unless it has a clearly different meaning in the context.

It will be further understood that the terms “comprises” and/or “comprising” utilized herein specify the presence of stated features or elements, but do not preclude the presence or addition of one or more other features or elements.

It will be understood that when a layer, region, or component is referred to as being “on” or “onto” another layer, region, or component, it may be directly or indirectly formed on the other layer, region, or component. For example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment is implemented differently, a specific process order may be performed differently from the described order. For example, two processes described in succession may be performed substantially concurrently (e.g., simultaneously), or may be performed in an order opposite to the described order.

It will be understood that when a layer, region, or component is referred to as being "on", "connected to", "coupled to", or "adjacent to" another element or layer, region, or component, the layer, region, or component may be directly connected to the another layer, region, or component, or indirectly connected to the another layer, region, or component as intervening layer, region, or component is present. For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as intervening layer, region, or component is present.

As used herein, the term "substantially," "about," and similar terms are used as terms of approximation and not as terms of degree, and are intended to account for the inherent deviations in measured or calculated values that would be recognized by those of ordinary skill in the art. "About" or "substantially", as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "substantially" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

FIG. 1 is a schematic perspective view of a display apparatus 1 according to an embodiment.

Referring to FIG. 1, the display apparatus may display an image. The display apparatus 1 may provide an image through a plurality of sub-pixels arranged in a display area (DA). Each of the plurality of sub-pixels of the display apparatus 1 may be a region capable of emitting light of a set or predetermined color. The display apparatus 1 may display an image by utilizing light emitted from the plurality of sub-pixels. In an embodiment, the plurality of sub-pixels may be to emit red, green, or blue light. In one or more embodiments, the plurality of sub-pixels may be to emit red, green, blue, or white light.

A non-display area (NDA) may be around or at least partially surround the display area DA. In an embodiment, the non-display area NDA may entirely surround the display area DA. The non-display area NDA may be an area that does not provide an image.

The display area DA may have a polygonal shape including a tetragon as shown in FIG. 1. In an embodiment, the display area DA may have a rectangular shape in which a horizontal length is longer than a vertical length, a rectangular shape in which a horizontal length is shorter than a vertical length, or a square shape. In one or more embodiments, the display area DA may have one or more suitable shapes such as an ellipse or a circle. In an embodiment, the display apparatus 1 may include a light-emitting device layer 10, a light control layer 20, and an optical functional layer 30. The light-emitting device layer 10, the light control layer 20, and the optical functional layer 30 may be stacked in a thickness direction (e.g., the z direction), and may further include an encapsulation layer 40.

The display apparatus 1 having the above-described structure may be included in a mobile phone, a television, a billboard, a monitor, a tablet PC, a laptop, and/or the like.

Figure 2:
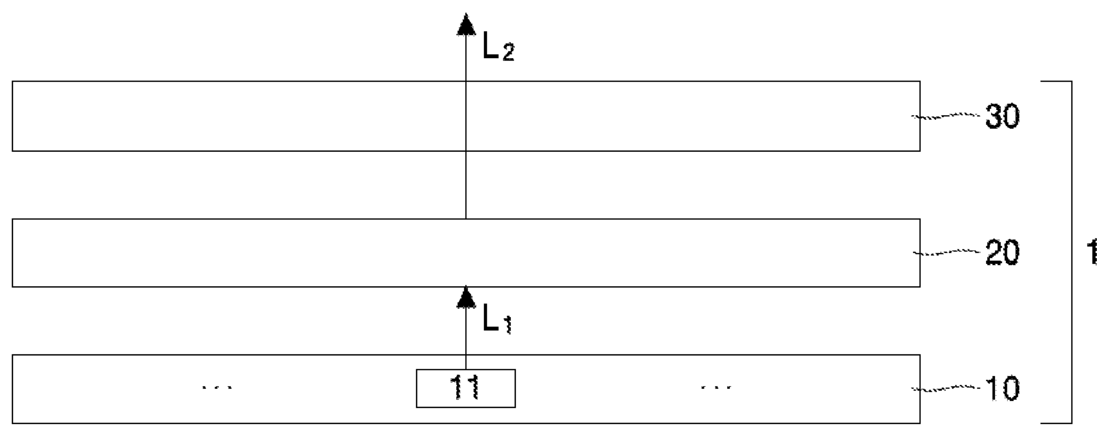
FIGS. 2-4 are each a schematic cross-sectional view of a display apparatus according to an embodiment.
Figure 2:
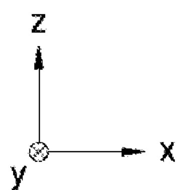

FIG. 2 is a schematic cross-sectional view of the display apparatus 1 according to an embodiment. Hereinafter, the structure of the display apparatus 1 according to an embodiment will be described in connection with FIG. 2.

Referring to FIG. 2, the display apparatus 1 includes: the light-emitting device layer 10 including a first light-emitting device 11; the light control layer 20 arranged on the light-emitting device layer 10; and the optical functional layer 30 arranged on the light control layer 20 and reducing a near-infrared transmittance, wherein the first light-emitting device 11 emits a first-color light $L_1$ of (e.g., in) a near-infrared region, and the light control layer 20 emits a second-color light $L_2$ of a visible region.

The display apparatus 1 of the disclosure may include the light-emitting device layer 10 that emits a first-color light of the near-infrared region, the light control layer 20 that emits a second-color light of the visible region, and the optical functional layer 30 that reduces the near-infrared transmittance.

Therefore, the light-emitting device layer 10 of the display apparatus 1 of the disclosure emits a first-color light of the near-infrared region, and thus, even when light of the visible region is introduced from external light (e.g., light incident from the outside of the display apparatus 1 toward the optical functional layer 30), there is no interaction with the light-emitting device layer 10 or the light control layer 20. Accordingly, the reflection by external light from a color filter may be reduced, and the contrast ratio of the display apparatus 1 may be improved.

In some embodiments, the display apparatus 1 of the disclosure may include the optical functional layer 30 that reduces the near-infrared transmittance, and thus when light corresponding to the near-infrared region among external light (e.g., light incident from the outside of the display apparatus 1 toward the optical functional layer 30) transmits the light control layer 30, the reflection of the light generated by excitation to be recognized by a user may be prevented or reduced or minimized or reduced.

[Optical Functional Layer 30]

The optical functional layer 30 of the disclosure may reduce near-infrared transmittance. In an embodiment, when external light reaches the optical functional layer 30, light having a wavelength in the near-infrared region may be absorbed by the optical functional layer 30. In one or more embodiments, only light having a wavelength in the visible region may pass through the optical functional layer 30. Accordingly, only the light of the preset wavelength among the external light incident on the display apparatus 1 may pass through the optical function layer 30, and then may reach the light control layer 20 and/or a first light control unit (or first light control portion) 21. In some embodiments, a portion the incident light may be reflected from a counter electrode and/or a first pixel electrode at the bottom of the light control layer 20 and/or the first light control unit 21, to thereby be emitted to the outside again.

In an embodiment, the optical functional layer 30 may have a transmittance of light at 780 nm (e.g., at wavelength of 780 nm) of less than or equal to about 5%.

The term "transmittance" as utilized herein may be measured by utilizing a general transmittance meter that is commercially available.

In an embodiment, the optical functional layer 30 may have reflectance of less than or equal to about 5% with respect to light at 550 nm (e.g., (e.g., at wavelength of 550 nm).

The term "reflectance" as utilized herein may be measured by utilizing a general reflectance meter that is commercially available.

In an embodiment, the optical functional layer 30 may have a transmittance of light at 550 nm (e.g., at wavelength of 550 nm) of greater than or equal to about 5%.

Although the optical functional layer 30 has reflectance within a satisfactory range, the display apparatus 1 having low reflection and an excellent or suitable contrast ratio may be implemented.

In an embodiment, the optical functional layer 30 may have a thickness of greater than or equal to about 20 nm and less than or equal to about 2,000 nm, but the embodiment is not limited thereto.

[Light Control Layer 20]

In an embodiment, the light control layer 20 may include a multiphoton absorbent material, and the multiphoton absorbent material may absorb and excite the first-color light to emit the second-color light.

The term "multiphoton absorbent material" may absorb and excite the first-color light through a multiphoton absorption phenomenon, so as emit the second-color light.

The term "multiphoton absorption phenomenon" as utilized herein may refer to, for example, a two-photon excitation phenomenon that a molecule absorbs an energy generated by concurrent or simultaneous annihilation of two photons in a case where the energy ($E_p$) of a photon is half the energy difference ($\Delta E$) between two quantum states.

In some embodiments, a phenomenon that a molecule absorbs an energy generated by concurrent or simultaneous annihilation of two or more photons in a similar quantum mechanical process may be referred to as the multiphoton absorption phenomenon.

In an embodiment, the multiphoton absorbent material may include an organic material, an inorganic material, or one or more combinations thereof.

In an embodiment, the multiphoton absorbent material may include an organic material including a carbon-carbon double bond.

In an embodiment, the organic material may include a pi-conjugation. In an embodiment, the organic material may include a $C_2$-$C_{200}$ alkenyl group, a $C_3$-$C_{200}$ carbocyclic group, a $C_1$-$C_{200}$ heterocyclic group unsubstituted or substituted with at least one $R_{10a}$, or one or more combinations thereof, wherein $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "$C_2$-$C_{200}$ alkenyl group" as utilized herein refers to a monovalent hydrocarbon group having at least one carbon-carbon double bond in the middle or at the terminus of the $C_2$-$C_{200}$ alkyl group, and examples thereof are an ethenyl group, a propenyl group, a butenyl group, and/or the like.

The term "$C_3$-$C_{200}$ carbocyclic group" as utilized herein refers to a cyclic group consisting of carbons only as ring-forming atoms and having 3 to 200 carbon atoms, and the term "$C_1$-$C_{200}$ heterocyclic group" as utilized herein refers to a cyclic group that has 1 to 60 carbon atoms and further has, in addition to carbon(s), a heteroatom as a ring-forming atom. The $C_3$-$C_{200}$ carbocyclic group and the $C_1$-$C_{200}$ heterocyclic group may each be a monocyclic group consisting of one ring or a polycyclic group in which two or more rings are condensed with each other. For example, the number of ring-forming atoms of the $C_1$-$C_{200}$ heterocyclic group may be from 3 to 201.

For example, the organic material may be trans-stilben or a porphyrin-based compound, but is not limited thereto.

The "porphyrin-based compound" as utilized herein refers to a compound including a core in which four pyrrole structures are linked by methine groups.

In an embodiment, the multiphoton absorbent material may include a quantum dot, a nanoparticle, or one or more combinations thereof.

The "quantum dot" as utilized herein may be understood by referring to the related description to be presented later.

The term "nanoparticle" as utilized herein refers to a particle having a dimension of less than or equal to about 100 nm, and may include an inorganic material, an organic material, or one or more combinations thereof.

For example, the multiphoton absorbent material may be a CdSe/CdS semiconductor compound, but is not limited thereto.

In an embodiment, the first-color light may have a maximum emission wavelength of greater than or equal to about 780 nm and less than or equal to about 1,000 nm.

In an embodiment, the second-color light may have a maximum emission wavelength of greater than or equal to about 400 nm and less than or equal to about 700 nm.

In an embodiment, the second-color light may have a maximum emission wavelength of greater than or equal to about 500 nm and less than or equal to about 600 nm.

In an embodiment, the display apparatus may have a reflectance (in an SCE mode) of about 0.60% or less or less than 0.60%, for example, less than or equal to about 0.59%, less than or equal to about 0.58%, less than or equal to about 0.57%, less than or equal to about 0.56%, or less than or equal to about 0.55%.

In an embodiment, the light-emitting device layer 10 of the disclosure may include the first light-emitting device 11.

In an embodiment, the light-emitting device layer 10 may include the first light-emitting device 11, and the first light-emitting device 11 may include: a first electrode; a second electrode facing the first electrode; and an interlayer arranged between the first electrode and the second electrode and including a first emission layer, and the first emission layer may emit a first-color light.

In an embodiment, the first light-emitting device 11 may include an organic light-emitting diode including an organic material. In one or more embodiments, the first light-emitting device 11 may include an inorganic light-emitting diode. In one or more embodiments, first light-emitting device 11 may include a quantum dot toward the first emission layer. In an embodiment, the size of the first light-emitting device 11 may be a micro-scale or a nano-scale. In an embodiment, the first light-emitting device 11 may be a micro-scale light-emitting device. In one or more embodiments, the first light-emitting device 11 may be a nano-scale light-emitting device. Such a nano-scale light emitting device may include gallium nitrogen (GaN).

Figure 3:
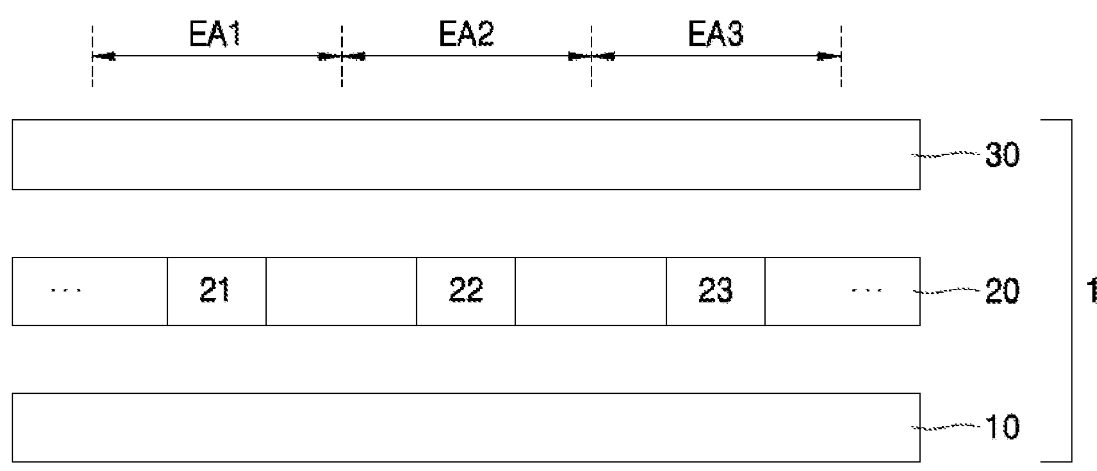
Figure 3:
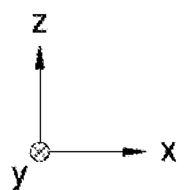
Figure 4:
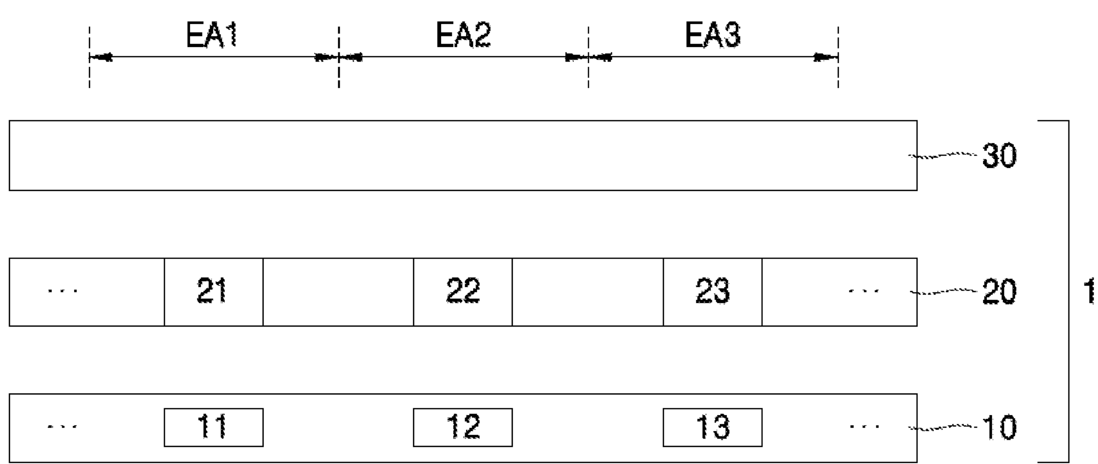
Figure 4:
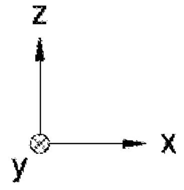

FIGS. 3 and 4 are each a schematic cross-sectional view of the display apparatus 1 according to an embodiment.

Referring to FIGS. 3 and 4, the display apparatus 1 may include a first emission area (EA1), a second emission area (EA2), and a third emission area (EA3).

In an embodiment, the light control layer 20 may include a first light control layer 21 corresponding to the first emission area EA1, a second light control unit 22 corresponding to the second emission area EA2, and a third light control unit 23 corresponding to the third emission area EA3, wherein the first light control unit 21 may emit the second-color light as described above.

In an embodiment, the first light control unit 21, the second light control unit 22, and the third light control unit 23 may emit light of different colors from each other. For example, the first light control unit 21 may emit green light (Lg), the second light control unit 22 may emit red light (Lr), and the third light control unit 23 may emit blue light (Lb).

For example, the first light control unit 21 may emit green light Lg having a maximum emission wavelength of greater than or equal to about 500 nm and less than or equal to 600 nm, the second light control unit 22 may emit blue light Lb having a maximum emission wavelength of greater than or equal to 400 nm and less than or equal to 500 nm, and the third light control unit 23 may emit red light Lr having a maximum emission wavelength of greater than or equal to 600 nm and less than or equal to 700 nm.

In an embodiment, the first light control unit 21, the second light control unit 22, and the third light control unit 23 may be spaced apart from each other on the light control layer 20.

In an embodiment, the first light control unit 21 may include a first multiphoton absorbent material that absorbs and excites the first-color light to emit green light having a maximum emission wavelength of greater than or equal to 500 nm and less than or equal to 600 nm, the second light control unit may include a second multiphoton absorbent material that absorbs and excites the first-color light to emit blue light having a maximum emission wavelength of greater than or equal to 400 nm and less than or equal to 500 nm, and the third light control unit may include a third multiphoton absorbent material that absorbs and excites the first-color light to emit red light having a maximum emission wavelength of greater than or equal to 600 nm and less than or equal to 700 nm.

In an embodiment, the first multiphoton absorbent material, the second multiphoton absorbent material, and the third multiphoton absorbent material may be identical to or different from each other.

In an embodiment, the light-emitting device layer 10 may include the first light-emitting device 11, and the first light-emitting device 11 may include: the first electrode; the second electrode facing the first electrode; and the interlayer arranged between the first electrode and the second electrode and including the first emission layer, and the first emission layer may emit a first-color light.

Referring to FIG. 4, the light-emitting device layer 10 may include the first light-emitting device 11 corresponding to the first emission area, the second light-emitting device 12 corresponding to the second emission area, and the third light-emitting device 13 corresponding to the third emission area, wherein the first light-emitting device 11 may emit the first-color light.

In an embodiment, the first to third light-emitting devices 11, 12, and 13 may each include an organic light-emitting diode. In one or more embodiments, the first to third light-emitting devices 11, 12, and 13 may each include an inorganic light-emitting diode. The inorganic light-emitting diode may include a PN junction diode including an inorganic semiconductor-based material. When a voltage is applied to the PN junction diode in the forward direction, holes and electrons are injected, and energy generated by recombination of the holes and electrons may be converted into light energy to emit light of a set or predetermined color. The inorganic light-emitting diode may have a width of several to several hundred micrometers or several to several hundred nanometers. In an embodiment, the light-emitting diode (LED) may be an LED including a quantum dot. As described above, the emission layer of the LED may include an organic material, an inorganic material, a quantum dot, both (e.g., simultaneously) an organic material and a quantum dot, or both (e.g., simultaneously) an inorganic material and a quantum dot.

The first to third light emitting devices 11, 12, and 13 may emit light of the same or different wavelength ranges. For example, light emitted from the first to third light emitting devices 11, 12, and 13 (e.g., the first-color light of the near-infrared region) may reach the optical functional layer 30 by passing through the light control layer 20 on light-emitting device layer 10.

In an embodiment, the first to third light emitting-devices 11, 12, and 13 may be spaced apart from or in contact with each other, on the light-emitting device layer 10.

In an embodiment, the second light-emitting device 12 may emit third-color light of the visible region or the near-infrared region.

In an embodiment, the third light-emitting device 13 may emit fourth-color light of the visible region or the near-infrared region.

In an embodiment, the third-color light and the fourth-color light may each have a maximum emission wavelength of greater than or equal to about 500 nm and less than or equal to about 600 nm.

For example, the second light-emitting device 12 and the third light-emitting device 13 may each emit blue light Lb.

In an embodiment, the second light control unit 22 and the third light control unit 23 may each independently include a scatterer, a color conversion material, and/or a multiphoton absorbent material.

In an embodiment, when the second light-emitting device 12 emits light of the near-infrared region, the second light control unit 22 may include a multiphoton absorbent material.

In an embodiment, when the third light-emitting device 13 emits light of the near-infrared region, the third light control unit 23 may include a multiphoton absorbent material.

In an embodiment, when the second light-emitting device 12 emits light of the visible region, the second light control unit 22 may be a transmission layer or a color conversion layer.

In an embodiment, when the third light-emitting device 13 emits light of the visible region, the third light control unit 23 may be a transmission layer or a color conversion layer.

In an embodiment, the second light control unit 22 and the third light control unit 23 may each include a scatterer or a color conversion material.

The "scatterer" as utilized herein refers to a material that scatters light to emit more light.

When the scatterer is included, light output efficiency may be increased.

In an embodiment, the scatterer may be any material of a metal or a metal oxide to evenly scatter light.

For example, the scatterer may include at least one of $TiO_2$, $ZrO_2$, $Al_2O_3$, $In_2O_3$, ZnO, $SnO_2$, $Sb_2O_3$, or ITO.

In an embodiment, the scatterer may have a refractive index of greater than or equal to 1.5. Accordingly, the second light control unit 22 and/or the third light control unit 23 may have improved light output efficiency.

In an embodiment, the color conversion material may include a quantum dot.

The "quantum dot" as utilized herein may be understood by referring to the related description to be presented later.

In an embodiment, the second light control unit 22 may transmit the third-color light emitted from the second light-emitting device 12; or may emit light having a wavelength band different from that of the third-color light.

In an embodiment, the third light control unit 23 may transmit the fourth-color light emitted from the third light-emitting device 13; or may emit light having a wavelength band different from that of the fourth-color light.

In an embodiment, the second light-emitting device 12 may emit the third-color light of the visible region, and may further include a first-color filter that is arranged between the light control layer 20 and the optical functional layer 30 and corresponds to the second emission area EA2.

In an embodiment, the third light-emitting device 13 may emit the fourth-color light of the visible region, and may further include a second-color filter that is arranged between the light control layer 20 and the optical functional layer 30 and corresponds to the third emission area EA3.

In an embodiment, the first-color filter and the second-color filter may each be formed of a photosensitive resin material. The first-color filter and the second-color filter may each include a dye representing a unique color. The first-color filter may transmit only light having a wavelength in a range of about 400 nm to about 500 nm, and the second-color filter may transmit only light having a wavelength in a range of about 600 nm to about 700 nm.

[Light-Emitting Device Layer 10]

Figure 5:
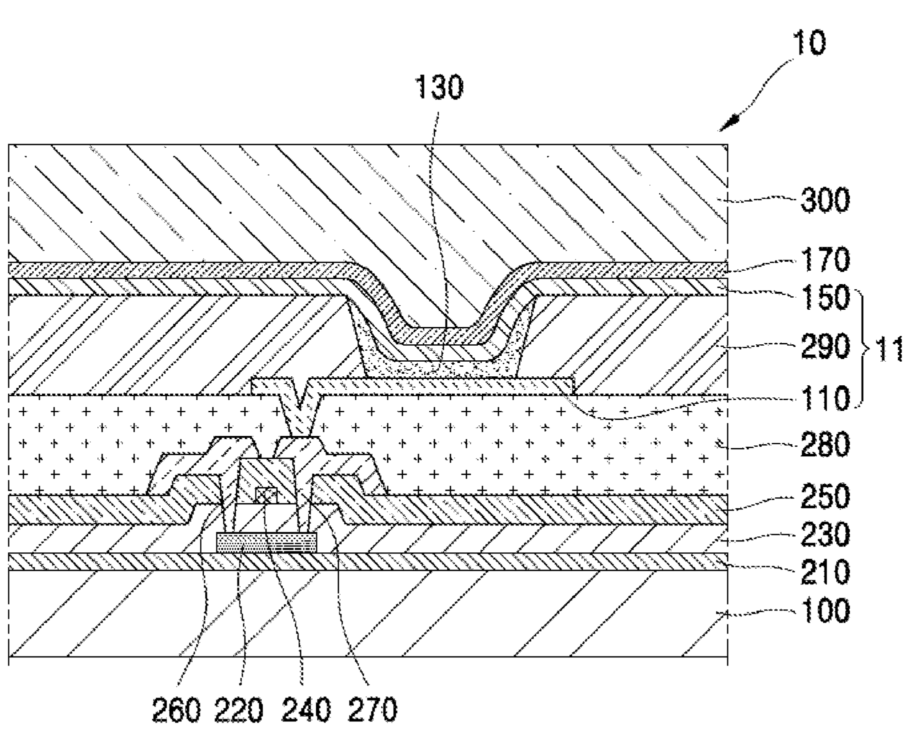
FIG. 5 is a schematic cross-sectional view of a portion of a light-emitting device layer according to an embodiment.

FIG. 5 is a schematic cross-sectional view of a portion of the light-emitting device layer 10 according to an embodiment.

In an embodiment, light-emitting device layer 10 may include a substrate 100, a thin-film transistor TFT, light-emitting devices 11, 12, and 13, and an encapsulation portion 300 for sealing the light-emitting devices 11, 12, and 13.

The substrate 100 may be a flexible substrate, a glass substrate, or a metal substrate. A buffer layer 210 may be arranged on the substrate 100. The buffer layer 210 may prevent or reduce penetration of impurities through the substrate 100 and may provide a flat surface on the substrate 100.

A TFT may be arranged on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be arranged on the activation layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to insulate them from one another.

The source electrode 260 and the drain electrode 270 may be arranged on the interlayer insulating film 250. The interlayer insulating film 250 and the gate insulating film 230 may be formed to expose the source region and the drain region of the activation layer 220, and the source electrode 260 and the drain electrode 270 may be arranged in contact with the exposed portions of the source region and the drain region of the activation layer 220.

The TFT may be electrically connected to a light-emitting device to drive the light-emitting device, and may be covered and protected by a passivation layer 280. The passivation layer 280 may include an inorganic insulating film, an organic insulating film, or one or more combinations thereof. The light-emitting devices 11, 12, and 13 may be provided on the passivation layer 280. Each of the light-emitting devices 11, 12, and 13 may include a first electrode 110, an interlayer 130, and a second electrode 150.

The first electrode 110 may be arranged on the passivation layer 280. The passivation layer 280 may be arranged to expose a portion of the drain electrode 270, not fully covering the drain electrode 270, and the first electrode 110 may be arranged to be connected to the exposed portion of the drain electrode 270.

A pixel defining layer 290 including an insulating material may be arranged on the first electrode 110. The pixel defining layer 290 may expose a certain region of the first electrode 110, and an interlayer 130 may be formed in the exposed region of the first electrode 110. The pixel defining layer 290 may be a polyimide or polyacrylic organic film. In one or more embodiments, at least some layers of the interlayer 130 may extend beyond the upper portion of the pixel defining layer 290 and may thus be arranged in the form of a common layer.

The interlayer 130 may include a low molecular weight material or a high molecular weight material. When the interlayer 130 includes a low molecular weight material, the interlayer 130 may have a single-layered structure or a stacked composite structure, each including or consisting of a hole injection layer (HIL), a hole transport layer (HTL), an emission layer (EML), an electron transport layer (ETL), an electron injection layer (EIL), and/or the like, wherein each structure may be formed according to a vacuum deposition method. When the interlayer 130 includes a high molecular weight material, the interlayer 130 may have a structure including or consisting of an HTL and an EML. Here, the HTL may include PEDOT, and the EML may include a poly-phenylenevinylene (PPV)-based high molecular weight material, a polyfluorene-based high molecular weight material, and/or the like. The interlayer 130 may be formed by a screen-printing method, an inkjet printing method, a deposition method, a laser induced thermal imaging (LITI) method, and/or the like. The interlayer 130 is not necessarily limited thereto, and may have one or more suitable structures.

In some embodiments, the interlayer 130 may be a single layer formed over the first emission area EA1 to the third emission area EA3, or when necessary, the interlayer 130 may include layers patterned to correspond to the first emission area EA1 to the third emission area EA3, respectively. In any case, the interlayer 130 may include the first EML. The first EML may be an integral layer over the first emission area EA1 to the third emission area EA3, or when necessary, the first EML may be pattered to correspond to each of the first emission area EA1 to the third emission area EA3. The first EML may emit a first-color light, for example, light having a wavelength in a range of about 780 nm to about 1,000 nm.

The second electrode 150 may be arranged on the interlayer 130, and a capping layer 170 may be additionally formed on the second electrode 150. The capping layer 170 may be formed to cover the second electrode 150. The second electrode 150 may also be an integral layer over the first emission area EA1 to the third emission area EA3, or when necessary, the second electrode 150 may include layers patterned to correspond to each of the first emission area EA1 to the third emission area EA3.

The encapsulation portion 300 may be arranged on the capping layer 170. The encapsulation portion 300 may be arranged on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or one or more combinations thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or one or more combinations thereof; or one or more combinations of the inorganic films and the organic films.

[Quantum Dot]

The term "quantum dot" as utilized herein refers to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and then growing quantum dot particle crystals. When the crystal grows, the organic solvent naturally acts as a dispersant coordinated on the surface of the quantum dot crystal and controls the growth of the crystal so that the growth of quantum dot particles can be controlled or selected through a process which costs lower, and is easier than vapor deposition methods, such as metal organic chemical vapor deposition (MOCVD) or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or one or more combinations thereof.

Examples of the Group II-VI semiconductor compound are: a binary compound, such as CdS, CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or one or more combinations thereof.

Examples of the Group III-V semiconductor compound are: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or one or more combinations thereof. In an embodiment, the Group III-V semiconductor compound may further include a Group II element. Examples of the Group III-V semiconductor compound further including the Group II element are InZnP, InGaZnP, InAlZnP, and/or the like.

Examples of the Group III-VI semiconductor compound are: a binary compound, such as GaS, GaSe, $Ga_2Se_3$, GaTe, InS, InSe, $In_2S_3$, $In_2Se_3$, InTe, and/or the like; a ternary compound, such as $InGaS_3$, $InGaSe_3$, and/or the like; or one or more combinations thereof.

Examples of the Group I-III-VI semiconductor compound are: a ternary compound, such as AgInS, $AgInS_2$, CuInS, $CuInS_2$, $CuGaO_2$, $AgGaO_2$, $AgAlO_2$, and/or the like; or one or more combinations thereof.

Examples of the Group IV-VI semiconductor compound are: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or one or more combinations thereof.

Examples of the Group IV element or compound are: a single element compound, such as Si, Ge, and/or the like; a binary compound, such as SiC, SiGe, and/or the like; or one or more combinations thereof.

Each element included in a multi-element compound, such as the binary compound, the ternary compound, and the quaternary compound, may be present at a substantially uniform concentration or non-substantially uniform concentration in a particle.

In an embodiment, the quantum dot may have a single structure in which the concentration of each element in the quantum dot is substantially uniform, or may have a core-shell dual structure. For example, a material included in the core and a material included in the shell may be different from each other.

The shell of the quantum dot may act as a protective layer which prevents chemical denaturation of the core to maintain semiconductor characteristics, and/or as a charging layer which impart electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot are an oxide of metal, metalloid, or non-metal, a semiconductor compound, or a combination thereof. Examples of the oxide of metal, metalloid, or non-metal are: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; a ternary compound, such as $MgAl_2O_4$, $CoFe_2O_4$, $NiFe_2O_4$, $CoMn_2O_4$, and/or the like; or one or more combinations thereof. Examples of the semiconductor compound are: as described herein, a Group II-VI semiconductor compound; a Group III-V semiconductor compound; a Group III-VI semiconductor compound; a Group I-III-VI semiconductor compound; a Group IV-VI semiconductor compound; or one or more combinations thereof. Examples of the semiconductor compound are CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or one or more combinations thereof.

The quantum dot may have a full width of half maximum (FWHM) of the emission wavelength spectrum of about 45 nm or less, about 40 nm or less, or for example, about 30 nm or less. When the FWHM of the quantum dot is within these ranges, the quantum dot may have improved color purity or color reproducibility. In some embodiments, because light emitted through the quantum dot is emitted in all directions, the wide viewing angle may be improved.

In some embodiments, the quantum dot may be in the form of spherical, pyramidal, multi-arm, or cubic nanoparticles, nanotubes, nanowires, nanofibers, or nanoplate particles.

The quantum dot may control the color of light emitted according to the particle size, and accordingly, the quantum dot may have one or more suitable emission colors such as blue, red, and green.

EXAMPLES

Next, referring to FIG. 6 and Table 1, a change in reflectance of the display apparatus 1 according to the wavelength region of the first-color light emitted by the light-emitting device layer 10 including the first light-emitting device 11 and the configuration of the optical functional layer will be described.

Evaluation Example

In each of Sample 1 and Sample 2, a partition wall for quantum dot (QD) filling was formed on the first light-emitting device emitting blue light, and a scatterer ($TiO_2$) and red and green QDs filled the partition wall to form a B/R/G light-emitting unit. After passivation utilizing an inorganic film, a simulation tool was utilized so that color filters (CFs) of B/R/G were configured to correspond to each color on the inorganic film. Then, light emitted by the first light-emitting device 12 was set to reach the light control layer 20 in substantially the same way, and depending on whether external light reached the light control layer 20 or whether light scattering occurred by external light, the reflectance was measured in such a way that the QDs excited and emitted light, and the measurement results are shown in FIG. 6. On this basis, the total reflectance was calculated, and the calculation results are shown in Table 1.

Here, a basic state of the simulation tool corresponds to Sample 2, and a state in which the degree of scattering by external light is 0 corresponds to Sample 1.

Figure 6:
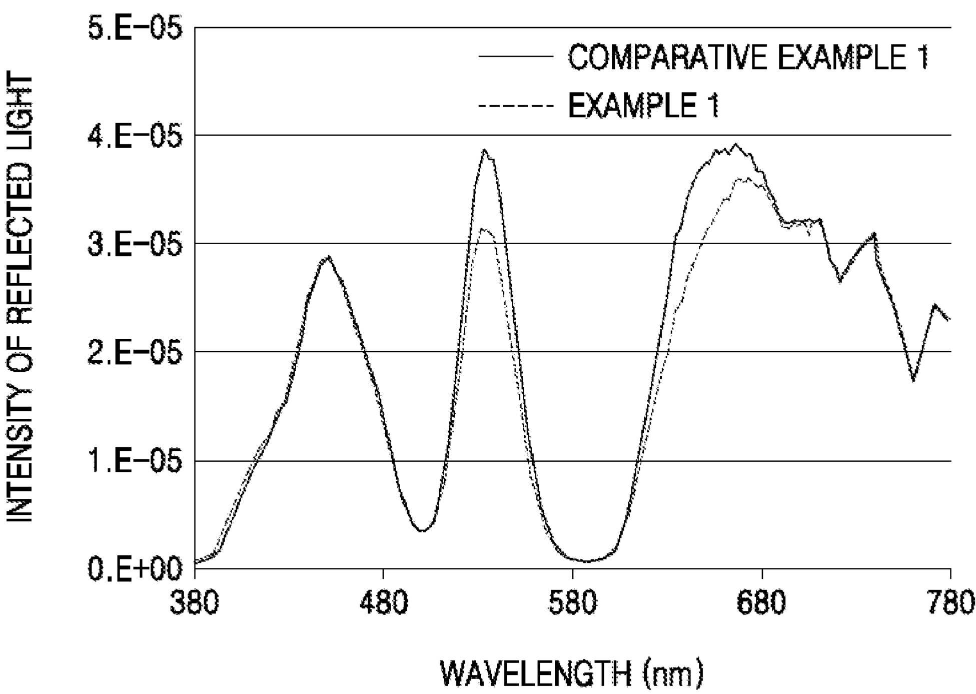
FIG. 6 is a graph showing reflectance measured in a specular component excluded (SCE) mode according to a wavelength of light for display apparatuses of Example 1 and Comparative Example 1.

The reflectance of FIG. 6 is a graph showing the reflectance measured in the SCE mode according to the wavelength of light reflected back to a reflectance measuring device after irradiating D65 light as a probe for the reflectance measuring device.

The graph represented by Example 1 is a graph of reflectance according to the wavelength of Sample 1. Sample 1 emitted a first-color light within the near-infrared ray ranges from the first light-emitting device, and thus corresponds to a display apparatus including an optical functional layer having a transmittance of light at 780 nm of 5%.

The graph represented by Comparative Example 1 is a graph of reflectance according to the wavelength of Sample 2. Sample 2 emitted not the first-color light within the near-infrared ray ranges, but blue light from the first light-emitting device, and thus corresponds to a display apparatus including an optical functional layer having a transmittance of light at 780 nm (e.g., at wavelength of 780 nm) of 80%.

TABLE 1

| | Sample | | | | |
|---|---|---|---|---|---|
| | Display apparatus | Light emitted from first light-emitting device of light-emitting device layer 10 (maximum emission wavelength, nm) | Light emitted from light control layer 20 (maximum emission wavelength, nm) | Optical functional layer | SCE (%) |
| Example 1 | Sample 1 | Near-infrared light (800 nm) | Green light (530 nm) | Transmittance at wavelength of 780 nm: 5% | 0.52% |
| Comparative Example 1 | Sample 2 | Blue light (470 nm) | Green light (530 nm) | Transmittance at wavelength of 780 nm: 80% | 0.61% |

Referring to FIG. 6 and Table 1, it was confirmed that the display apparatus of Example 1 had lower SCE reflectance than the display apparatus of Comparative Example 1.

According to the one or more embodiments, a display apparatus of the disclosure may include an optical functional layer, which absorbs and excites a first-color light of a near-infrared region to emit a second-color light of a visible region and reduces transmittance of near-infrared light. As the SCE reflectance by external light is reduced and the contrast ratio is improved, a display apparatus with improved image quality may be implemented. It should be understood that embodiments described herein should be considered in a descriptive sense only and not for purposes of limitation.

Descriptions of features or aspects within each embodiment should typically be considered as available for other similar features or aspects in other embodiments.

While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A display apparatus comprising:

a light-emitting device layer comprising a first light-emitting device within the light-emitting device layer;

a light control layer comprising a first light control unit on the light-emitting device layer; and an optical functional layer on the light control layer and configured to reduce near-infrared transmittance, wherein the first light-emitting device is configured to emit a first-color light in a near-infrared region, and the light control layer is configured to emit a second-color light in a visible region.

2. The display apparatus of claim 1, wherein the optical functional layer has a transmittance of light at 780 nm of less than or equal to about 5%.

3. The display apparatus of claim 1, wherein the optical functional layer has a reflectance of light at 550 nm of less than or equal to about 5%.

4. The display apparatus of claim 1, wherein the light control layer comprises a multiphoton absorbent material, and the multiphoton absorbent material is configured to absorb and excite the first-color light to emit the second-color light.

5. The display apparatus of claim 4, wherein the multiphoton absorbent material comprises an organic material, an inorganic material, or one or more combinations thereof.

6. The display apparatus of claim 4, wherein the multiphoton absorbent material comprises a carbon-carbon double bond.

7. The display apparatus of claim 4, wherein the multiphoton absorbent material comprises a quantum dot and/or a nanoparticle.

8. The display apparatus of claim 1, wherein the first-color light has a maximum emission wavelength of greater than or equal to about 780 nm and less than or equal to about 1,000 nm.

9. The display apparatus of claim 1, wherein the second-color light has a maximum emission wavelength of greater than or equal to about 400 nm and less than or equal to about 700 nm.

10. The display apparatus of claim 1, wherein the second-color light has a maximum emission wavelength of greater than or equal to about 500 nm and less than or equal to about 600 nm.

11. The display apparatus of claim 1, wherein the first light-emitting device comprises:

a first electrode;

a second electrode facing the first electrode; and an interlayer arranged between the first electrode and the second electrode and comprising a first emission layer, and the first emission layer is configured to emit the first-color light.

12. The display apparatus of claim 1, wherein a reflectance (SCE) of the display apparatus is less than about 0.60%.

13. The display apparatus of claim 1, wherein the light control layer comprises a first light control unit corresponding to a first emission area, a second light control unit corresponding to a second emission area, and a third light control unit corresponding to a third emission area, and the first light control unit is configured to emit the second-color light.

14. The display apparatus of claim 13, wherein the first light control unit, the second light control unit, and the third light control unit are spaced apart from each other on the light control layer.

15. The display apparatus of claim 13, wherein the first light control unit is configured to emit green light that has a maximum emission wavelength of greater than or equal to about 500 nm and less than or equal to about 600 nm, the second light control unit is configured to emit blue light that has a maximum emission wavelength of greater than or equal to about 400 nm and less than or equal to about 500 nm, and the third light control unit is configured to emit red light that has a maximum emission wavelength of greater than or equal to about 600 nm and less than or equal to about 700 nm.

16. The display apparatus of claim 13, wherein the first light control unit comprises a first multiphoton absorbent material that is configured to absorb and excite the first-color light to emit green light having a maximum emission wavelength of greater than or equal to about 500 nm and less than or equal to about 600 nm, the second light control unit comprises a second multiphoton absorbent material that is configured to absorb and excite the first-color light to emit blue light having a maximum emission wavelength of greater than or equal to about 400 nm and less than or equal to about 500 nm, and the third light control unit comprises a third multiphoton absorbent material that is configured to absorb and excite the first-color light to emit red light having a maximum emission wavelength of greater than or equal to about 600 nm and less than or equal to about 700 nm.

17. The display apparatus of claim 13, wherein the light-emitting device layer further comprises a second light-emitting device corresponding to the second emission area and a third light-emitting device corresponding to the third emission area, and the first light-emitting device corresponds to the first emission area.

18. The display apparatus of claim 17, wherein the second light-emitting device is configured to emit third-color light in a visible region or a near-infrared region, and the third light-emitting device is configured to emit fourth-color light in a visible region or a near-infrared region.

19. The display apparatus of claim 13, wherein the second light control unit and the third light control unit each independently comprise a scatterer, a color conversion material, and/or a multiphoton absorbent material.

20. The display apparatus of claim 19, wherein the color conversion material comprises a quantum dot.

* * * * *